(12) United States Patent
Greshishchev et al.

(10) Patent No.: US 10,727,854 B1
(45) Date of Patent: Jul. 28, 2020

(54) APPARATUS AND METHODS FOR REALIZATION OF N TIME INTERLEAVED DIGITAL-TO-ANALOG CONVERTERS

(71) Applicant: Ciena Corporation, Hanover, MD (US)

(72) Inventors: Yuriy Greshishchev, Ottawa (CA); Mahdi Parvizi, Kanata (CA); Douglas McPherson, Ottawa (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/510,489

(22) Filed: Jul. 12, 2019

(51) Int. Cl.
*H03M 1/12* (2006.01)
*H03M 1/06* (2006.01)
*H03M 1/66* (2006.01)

(52) U.S. Cl.
CPC ....... *H03M 1/1215* (2013.01); *H03M 1/0658* (2013.01); *H03M 1/66* (2013.01)

(58) Field of Classification Search
CPC ..... H03M 1/1215; H03M 1/66; H03M 1/0658
USPC .......................................... 341/144, 120, 118
See application file for complete search history.

(56) References Cited

U.S. PATENT DOCUMENTS 9,685,969 B1 * 6/2017 Garg ...................... H03M 1/10
10,305,504 B1 * 5/2019 Azenkot ................. H03K 5/135

OTHER PUBLICATIONS

E. Olieman et al., "An Interleaved Full Nyquist High-Speed DAC Technique", IEEE Journal of Solid-State Circuits, Mar. 2015, pp. 704-713, vol. 50, No. 3.
Y. Greshishchev et al., "A 56GS/s 6b DAC in 65nm CMOS with 256×6b Memory", IEEE International Solid-State Circuits Conference, 2011, pp. 194-196, San Francisco, CA.
J. Savoj et al., "A 12-GS/s Phase-Calibrated CMOS Digital-to-Analog Converter for Backplane Communications," IEEE Journal of Solid-State Circuits, May 2008, pp. 1207-1216, vol. 43, No. 5.

* cited by examiner

*Primary Examiner* — Khai M Nguyen
(74) *Attorney, Agent, or Firm* — Young Basile Hanlon & MacFarlane, P.C.

(57) ABSTRACT

Described herein are apparatus and methods for realization of time interleaved digital-to-analog converters (DACs) by detecting and aligning phase mismatches. In an implementation, a N-time interleaved DAC includes N DACs and N replica DACs, where a first set of N/2 DACs operate at a clock A and a second set of N/2 DACs operate at a clock B, and where N is at least two. The phase detector generates a phase detection output by comparing outputs of the first and second set of N/2 replica DACs with a multiplexor (MUX) clock, where the MUX clock is a multiple of a frequency of the clock A or the clock B. The clock A and the clock B are aligned with the MUX clock by advancing a phase of the clock A and the clock B until the phase detection output achieves a zero crossing.

20 Claims, 9 Drawing Sheets

US 10,727,854 B1

APPARATUS AND METHODS FOR REALIZATION OF N TIME INTERLEAVED DIGITAL-TO-ANALOG CONVERTERS

TECHNICAL FIELD

This disclosure relates to digital-to-analog converters (DACs). More specifically, this disclosure relates to realization of high speed N time interleaved DACs.

BACKGROUND

Modern optical systems increasingly rely on digital signal processor (DSP) Complementary Metal Oxide Semiconductor (CMOS) application-specific integrated circuit (ASICs) for reliable data transmission. These systems use digital-to-analog converters (DACs) to convert digital values to analog signals. An ongoing challenge towards DAC integration in CMOS technology is a requirement to operate with increased sampling rates in each new generation of systems. For example, a recent requirement is to operate above 100 Gs/s with 8-b resolution. Presently, these requirements are beyond the feasibility of modern CMOS technologies unless an interleaving approach is used.

A time interleaved DAC architecture allows, with an interleaving ratio of at least two, extension of the sampling rate limit by a factor of two if each DAC operates close to its technology limit. However, additional issues arise. These issues are related to, for example, accurate timing alignment between the DACs and with the CMOS analog block that does time interleaving. Factors like voltage, temperature, and process variations may result in phase mismatches and performance degradation.

SUMMARY

Described herein are apparatus and methods for realization of time interleaved digital-to-analog converters (DACs) by detecting and aligning phase mismatches. In an implementation, a N-time interleaved DAC includes N DACs and N replica DACs associated with the N DACs, where a first set of N/2 DACs and N/2 replica DACs operate at a clock A and a second set of N/2 DACs and N/2 replica DACs operate at a clock B, and where N is at least two. The N-time interleaved DAC further includes a phase detector connected to the first set of N/2 replica DACs and the second set of N/2 replica DACs. The phase detector generates a phase detection output by comparing outputs of the first set of N/2 replica DACs and the second set of N/2 replica DACs with a multiplexor (MUX) clock, where the MUX clock is a multiple of a frequency of the clock A or the clock B. The clock A and the clock B are aligned with the MUX clock by advancing a phase of the clock A and the clock B until the phase detection output achieves a zero crossing.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1A:
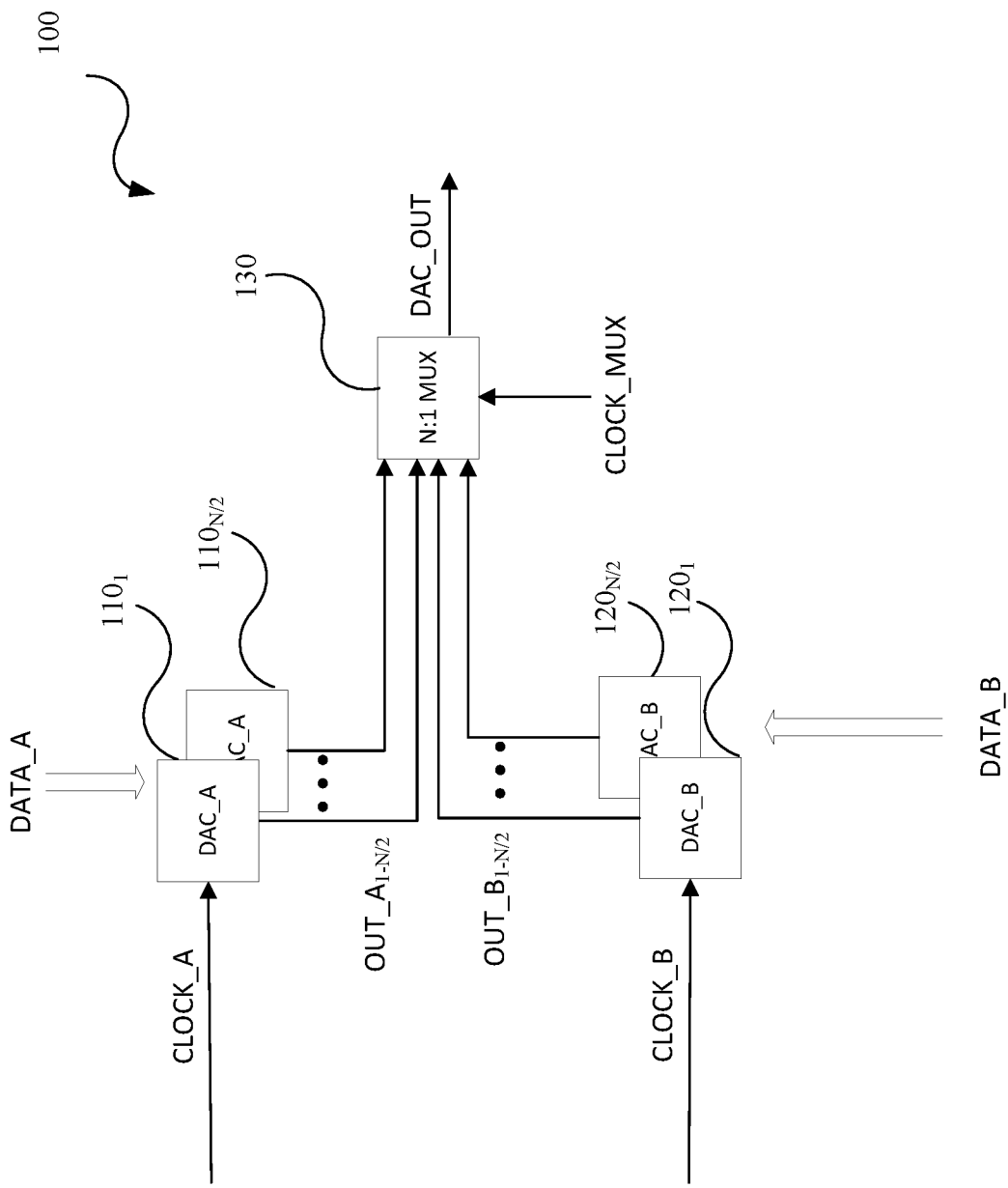
FIG. 1A is a block diagram of an example of a N-time interleaved digital-to-analog converter (DAC) device.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1A is a block diagram of an example of a N-time interleaved digital-to-analog converter (DAC) device 100 where N is at least two. In an implementation, the N-time interleaved DAC is a current-steering DAC. The N-time interleaved DAC device 100 may include a first set of N/2 DACs 110$_1$-110$_{N/2}$ which operate at CLOCK_A and a second set of N/2 DACs 120$_1$-120$_{N/2}$ which operate at CLOCK_B. The outputs of the first set of N/2 DACs 110$_1$-110$_{N/2}$ and the second set of N/2 DACs 120$_1$-120$_{N/2}$, i.e., OUT_A$_{1-N/2}$ and OUT_B$_{1-N/2}$, are connected to a N:1 multiplexor or an interleaver 130 (collectively "MUX"). The MUX 130 may be an analog multiplexer which operates at Clock_MUX, where Clock_MUX runs at half a sampling frequency (FS) (i.e. the clock rate is FS/2) and has an output DAC_OUT. Those of ordinary skill may thus recognize that other elements may be desirable or necessary to implement the N-time interleaved DAC described herein. However, because such elements are well known in the art, and because they do not facilitate a better understanding of the disclosed embodiments, a discussion of such elements may not be provided herein.

Figure 1B:
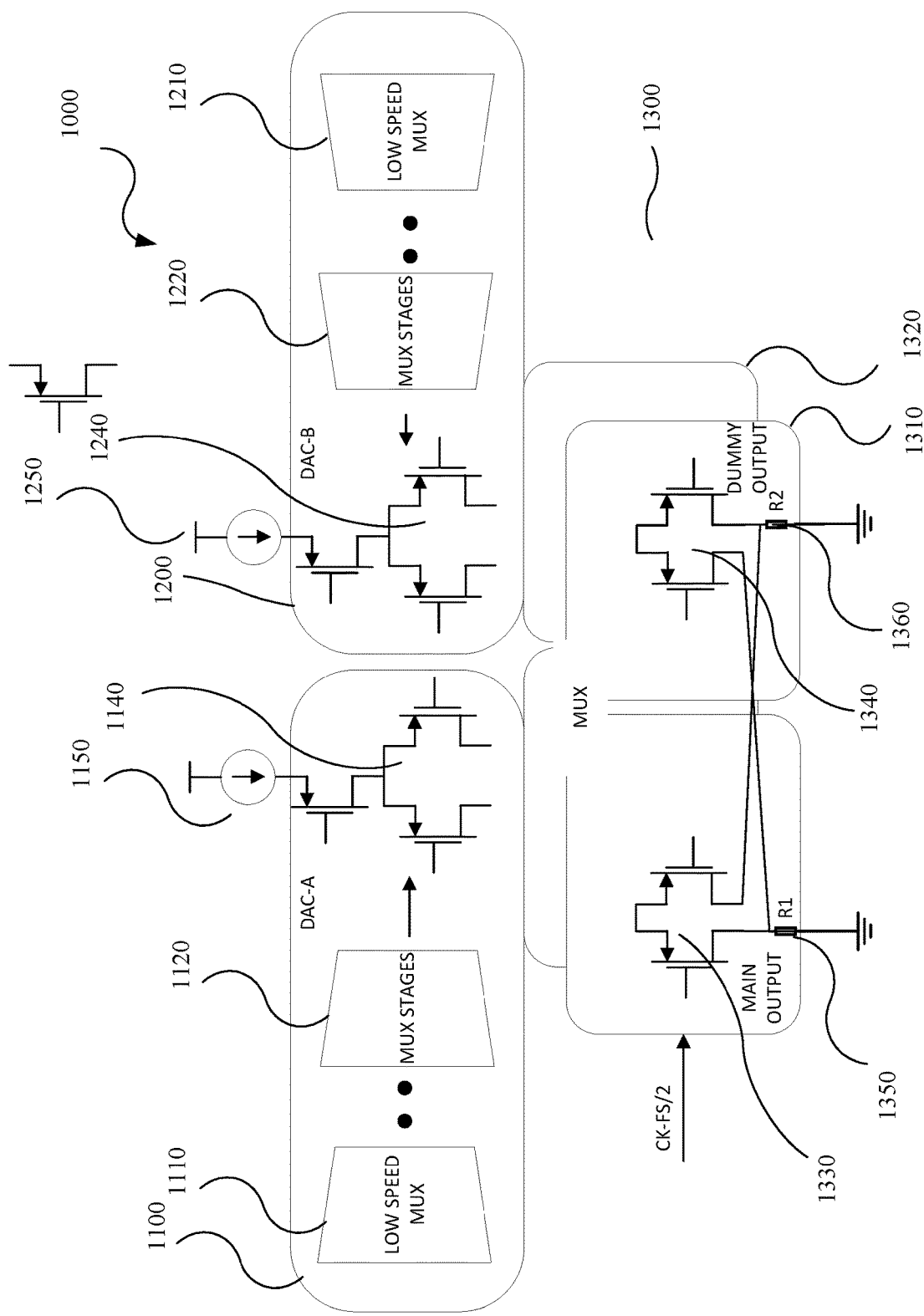
FIG. 1B is a block diagram of an example of a N-time interleaved digital-to-analog converter (DAC) device.

FIG. 1B is a block diagram of an example of a time interleaved DAC device 1000. In an implementation, the time interleaved DAC 1000 is a two-time interleaved DAC. Although the description herein is for a two-time interleaved DAC, the description is applicable to N-time interleaved DACs where N is greater than 2 without departing from the scope of the specification and claims. In an implementation, the two-time interleaved DAC is a current-steering DAC. The two-time interleaved DAC 1000 may include two DACs (DACs), DAC-A 1100 and DAC-B 1200, both of which are connected to a MUX 1300. The MUX 1300 may be an analog multiplexer that runs at half a sampling frequency (FS), (i.e. the clock rate is FS/2). Those of ordinary skill may thus recognize that other elements may be desirable or necessary to implement the time interleaved DAC described herein. However, because such elements are well known in the art, and because they do not facilitate a better understanding of the disclosed embodiments, a discussion of such elements may not be provided herein.

The MUX 1300 may include multiple channels or ports, such as channels 1310 and 1320. Each port or channel (for example, ports or channels 1310 and 1320) of the MUX 1300 may include a switch 1330 and 1340 which may have a main output 1350 and a dummy output 1360. Although the MUX 1300 is shown using Metal Oxide Semiconductor Field Effect Transistor (MOSFETs), other components and devices may be used without departing from the scope of the specification and claims.

The DAC-A 1100 may include a low speed MUX 1110 followed by a series of MUXes denoted as MUX stages 1120, where a final stage MUX may run at a clock rate of FS/4. Using conventional techniques, the FS/4 clock produced inside a clock generator from the FS/2 is passed to a clock tree driving the final stage MUX in the MUX stages 1120. The output of the MUX stages 1120 may be connected to a data switch 1140, which in turn is connected to a current source 1150. The outputs of the data switch 1140 may be connected to the channels 1310 and 1320, for example, of the MUX 1300. Although the DAC-A 1100 is shown using Metal Oxide Semiconductor Field Effect Transistor (MOSFETs), other components and devices may be used without departing from the scope of the specification and claims.

Similarly, the DAC-B 1200 may include a low speed MUX 1210 followed by a series of MUXes denoted as MUX stages 1220, where a final stage MUX may run at a clock rate of FS/2. Using conventional techniques, the FS/4 clock produced inside a clock generator from the FS/2 is passed to a clock tree driving the final state MUX in the MUX stages 1220. The output of the MUX stages 1220 may be connected to a data switch 1240, which in turn is connected to a current source 1250. The outputs of the data switch 1240 may be connected to the channels 1310 and 1320, for example, of the MUX 1300. Although the DAC-B 1200 is shown using Metal Oxide Semiconductor Field Effect Transistor (MOSFETs), other components and devices may be used without departing from the scope of the specification and claims.

Operationally, each DAC (DAC-A 1100 or DAC-B 1200) may be connected to the dummy output 1360 during a switching moment thereby placing the timing and settling related errors on only the dummy output 1360. After the DAC (DAC-A 1100 or DAC-B 1200) connected to the dummy output 1360 has settled, the DAC's (DAC-A 1100 or DAC-B 1200) output may then be connected to the main output 1350, and the other DAC (DAC-A 1200 or DAC-B 1100) may switch to and settle to its new code. In an implementation, the time interleaved DAC 1000 may operate as described in Erik Olieman, Anne-Johan Annema, and Bram Nauta, "An Interleaved Full Nyquist High-Speed DAC Technique", Journal of Solid-State Circuits, vol. 50, no. 3, March 2015, which is incorporated herein by reference in its entirety.

As shown, the DAC-A 1100, the DAC-B 1200 and the MUX 1300 may each run at a clock rate of FS/2 but the final MUX stages run at FS/4. Phase misalignments may cause errors in the operation of the time interleaved DAC 1000. Consequently, a circuit to detect phase mismatch between the FS/2 clock and the FS/4 clock and track the mismatch across voltage, temperature and process may be needed for operability and realization of the time interleaved DAC 1000.

Described herein are apparatus, device, and methods for realization of interleaved DACs. Clock phase alignment allows for independent clock distribution in the interleaved DACs and prevents setup and hold violations. Implementation of the phase detector makes realization of a N-time interleaved DAC with high sampling rate or frequency feasible. As described herein, the phase detector is a current domain XOR based phase detector whose zero crossing is aligned with perfect alignment of the FS/2-FS/4 clocks in a N-time interleaved DAC. A delay locked loop circuit which includes the phase detector, a loop filter, and an adjustable delay element enables realization of on chip clock alignment. Although the description herein is for a two-time interleaved DAC, the description is applicable to N-time interleaved DACs where N is greater than 2 without departing from the scope of the specification and claims.

Figure 2:
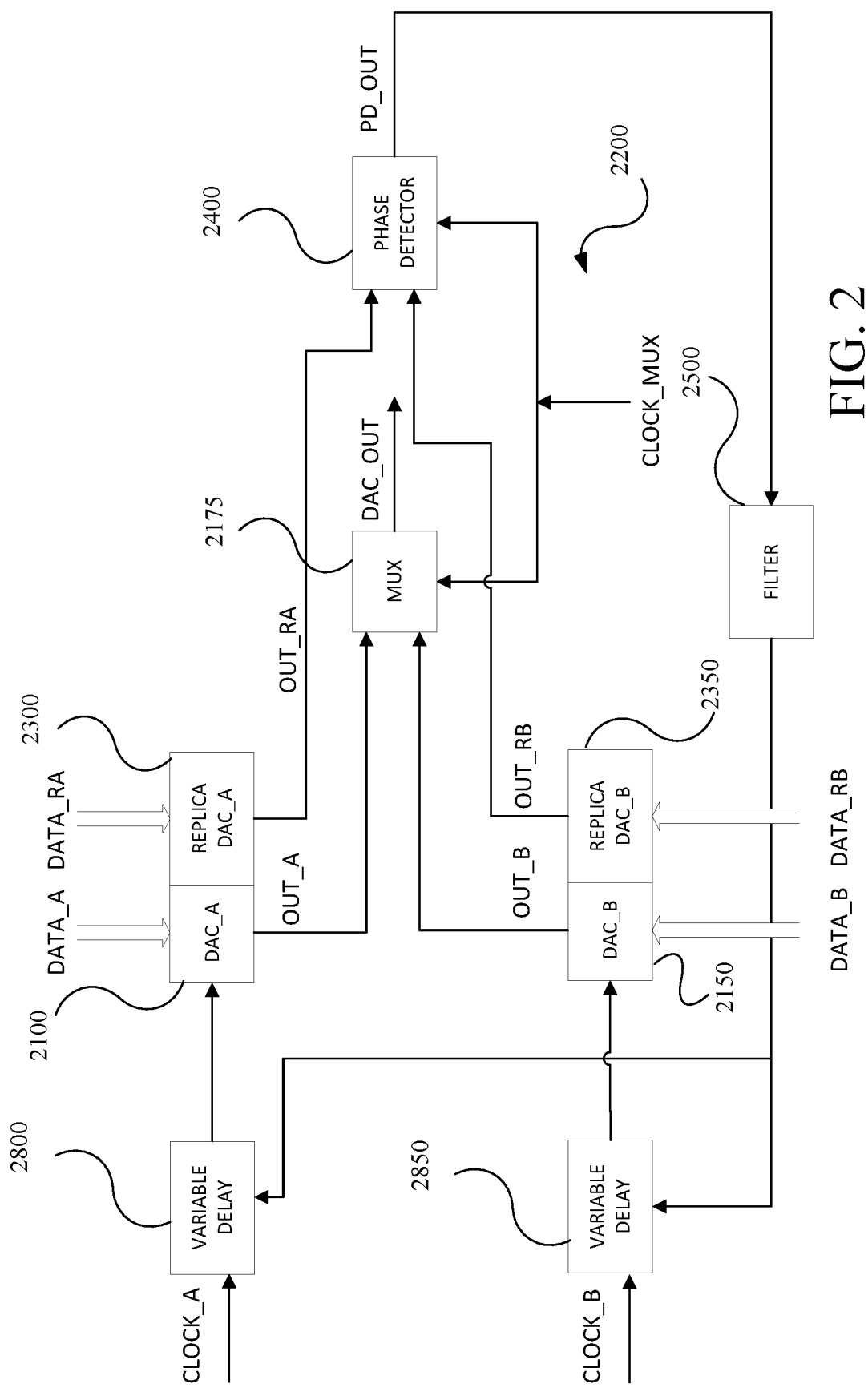
FIG. 2 is a block diagram of an example of a time interleaved DAC device in accordance with embodiments of this disclosure.

FIG. 2 is a block diagram of an example of a two-time interleaved DAC 2000 in accordance with embodiments of this disclosure. The two-time interleaved DAC 2000 may include a DAC_A 2100 and a DAC_B 2150, which are connected to a MUX 2175. Each of the DAC_A 2100 and the DAC_B 2150 may include phase detectors for aligning clock signals other than the FS/2-FS/4 clocks. In an implementation, these phase detectors may be implemented as described in Y. Greshishchev, et al., "A 56 GS/s 6b DAC in 65 nm CMOS with 256×6b Memory", in International Solid-State Circuit Conference, San Francisco, Calif., 2011, pp. 194-196, and J. Savoj, et al., "A 12-GS/s Phase-Calibrated CMOS Digital-to-Analog Converter for Backplane Communications," Journal of Solid-State Circuits, vol. 43, no. 5, May 2008, both of which are incorporated herein by reference in their entities. In an implementation, the DAC_A 2100, the DAC_B 2150, and the MUX 2175 may operate as described in FIGS. 1 and 2. Those of ordinary skill may thus recognize that other elements may be desirable or necessary to implement the two-time interleaved DAC described herein. However, because such elements are well known in the art, and because they do not facilitate a better understanding of the disclosed embodiments, a discussion of such elements may not be provided herein.

The two-time interleaved DAC 2000 may further include a replica DAC_A 2300 associated with the DAC_A 2100 and a replica DAC_B 2350 associated with the DAC_B 2150. The replica DAC_A 2300 and the replica DAC_B 2350 are connected to a delay lock loop circuit 2200, which is configured to align the FS/2-FS/4 clocks for realization of the two-time interleaved DAC 2000. That is, the delay lock loop circuit 2200 aligns the MUX 2175 and the final MUX stages of the DAC_A 2100 and the DAC_B 2150 using the feedback or alignment loop as shown in FIG. 2 to realize the two-time interleaved DAC 2000. The delay lock loop circuit 2200 may include a phase detector (PD) 2400 which is connected to the outputs of the replica DAC_A 2300 and the replica DAC_B 2350 (OUT_RA and OUT_RB), respectively. The output of the PD 2400 (PD_OUT) is connected to a loop filter 2500. In an implementation, the loop filter 2500 is a low pass filter (LPF). The loop filter 2500 is connected to variable delays 2800 and 2850. In an implementation, the variable delays 2800 and 2850 may be phase rotators.

Operationally, the DAC_A 2100 converts DATA_A and runs at a sampling frequency of FS/2 (denoted as CLOCK_A in FIG. 2) and the DAC_B 2150 converts DATA_B and runs at a sampling frequency of FS/2 (denoted as CLOCK_B in FIG. 2). The output of the DAC_A 2100 (OUT_A) and the output of the DAC_B 2150 (OUT_B) are input to the MUX 2175, which in turn generates the output of the two-time interleaved DAC 2000 (DAC_OUT).

The delay lock loop circuit 2200 aligns the FS/2 clock (CLOCK_MUX) with the FS/4 clock (i.e. CLOCK_A and CLOCK_B) that drives the final MUX stage in each DAC as shown in FIG. 1B. As stated previously, the FS/4 clock produced inside the clock generator from the FS/2 is passed to the clock tree driving the final MUX stage. To monitor the delay through the clock tree and the data channel, the output of the clock tree is fed back to the PD 2400 through the replica DAC_A 2300 and the replica DAC_B 2350. That is, the replica DAC_A 2300 converts DATA_RA with the same CLOCK_A as the DAC_A 2100 and the replica DAC_B 2300 converts DATA_RB with the same CLOCK_B as the DAC_B 2150. Then the output of the DAC_A 2300 (OUT_RA) and the output of the DAC_B 2350 (OUT_RB) are input to the PD 2400.

The PD 2400 compares the phase of the outputs OUT_RA and the OUT_RB are compared to the FS/2 clock (CLOCK_MUX) used for the MUX 2175. That is, the PD 2400 identifies the relevant zero crossings in a phase detection output. The PD 2400 outputs PD_OUT, which indicates whether the outputs OUT_RA and the OUT_RB (FS/4) are leading or lagging the MUX_CLOCK (FS/2). The PD_OUT is filtered via the loop filter 2500. For example, the loop filter 2500 may filter out the high frequency components and pass through a DC voltage component. The output of the loop filter 2500 feeds the variable delays 2800 and 2850, which rotates the phase of the CLOCK_A and the phase of the CLOCK_B, respectively, in fine steps to the point where the PD 2400 toggles, indicating that phase alignment has been achieved.

Figure 3:
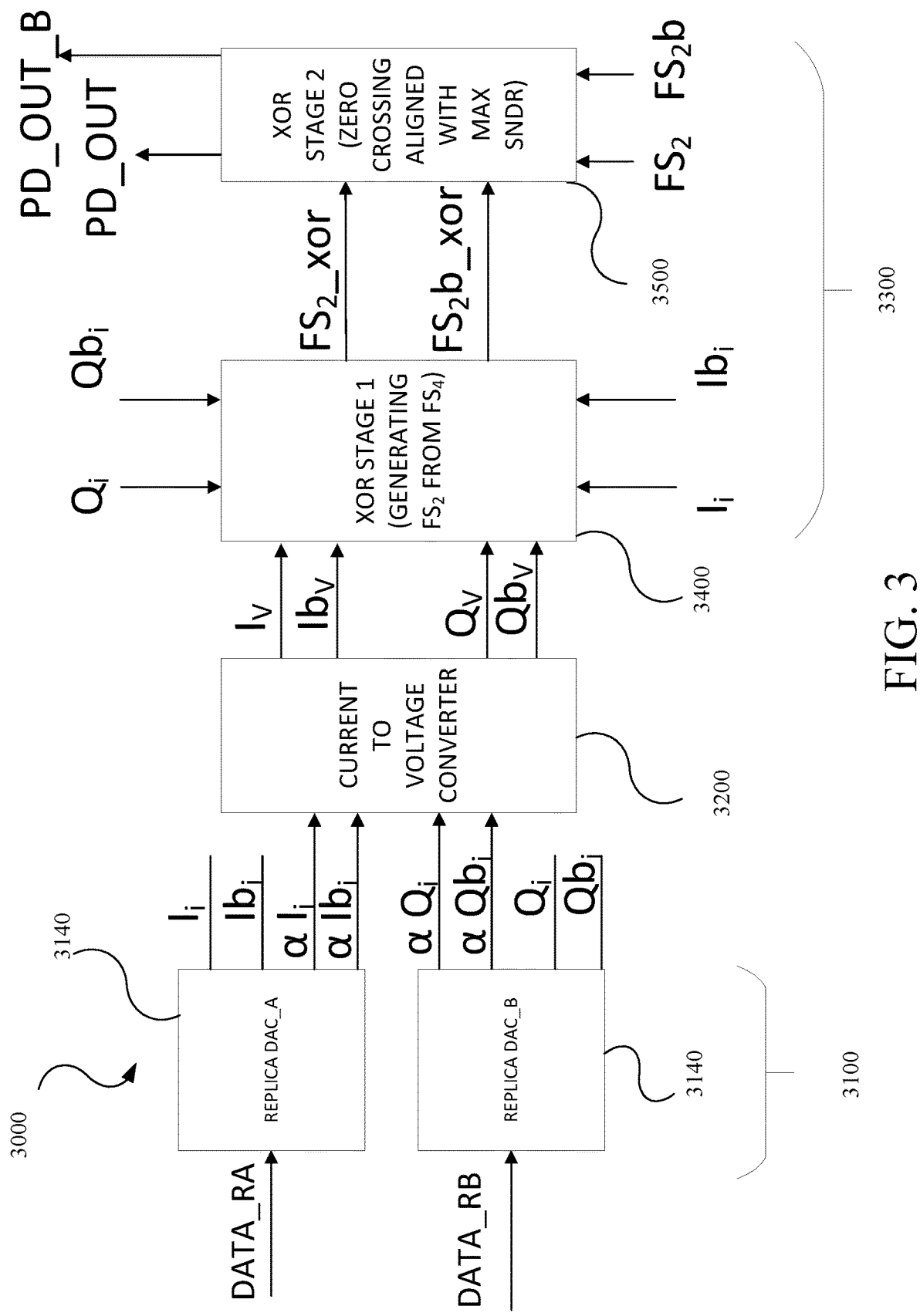
FIG. 3 is a block diagram of an example of a phase detector for a time interleaved DAC device in accordance with embodiments of this disclosure.

FIG. 3 is a block diagram of an example of a phase detector 3000 for a time interleaved DAC device in accordance with embodiments of this disclosure. Implementation of the phase detector 3000 (or PD 2400 of FIG. 2) addresses multiple technical issues. The first technical issue is that the replica FS/4 clocks, which have gone through the replica data path, are in the current domain whereas the FS/2 clock is in the voltage domain. Consequently, the replica FS/4 clocks should be converted to the voltage domain first with minimum delay (or vice versa). In addition, the PD 2400 receives replica clocks from both DACs (i.e., replica DAC_A 2300 and replica DAC_B 2350) and the high frequency of operation and switching at the FS/2 clock adds to the issues with implementing the phase detector 3000 (or PD 2400 of FIG. 2).

The phase detector 3000 may include a data path replication circuit 3100, which is connected to a current to voltage converter circuit 3200. The current to voltage converter circuit 3200 is further connected to an exclusive OR (XOR) circuit 3300, which generates the FS/2 clock in the current domain and identifies the zero crossings (which are aligned with maximum signal-to-noise plus distortion ratios) in the output of the phase detector 3000. The circuitry described herein for the phase detector 3000 mimics the performance of the MUX 1300 (shown in FIG. 1B) to minimize data path delay and phase detection mismatch. Although XOR circuits are described herein, other circuit implementations may be used which mimic the performance of the MUX 1300 without departing from the scope of the specification and claims described herein.

The data path replication circuit 3100 may include a replica DAC_A 3120 and a replica DAC_B 3140 which mimics the delay that the data path goes through (i.e., DAC_A 2100 and DAC_B 2150 in FIG. 2). The replica DAC_A 3120 processes an input DATA_RA (having a FS/4 in-phase clock signal ($FS_4$-I)) and outputs in-phase current ($I_i$), inverted in-phase current ($Ib_i$), α in-phase current ($\alpha I_i$), and α inverted in-phase current ($\alpha Ib_i$), where α is a gain factor. The replica DAC_B 3140 processes an input DATA_RB (having a FS/4 quadrature-phase clock signal ($FS_4$-Q)) and outputs quadrature-phase current ($Q_i$), inverted quadrature-phase current ($Qb_i$), α quadrature-phase current ($\alpha Q_i$), and a inverted quadrature-phase current ($\alpha Qb_i$), where α is a gain factor.

As noted, the outputs of the replica DAC_A 3120 and the replica DAC_B 3140 are in the current domain. The current to voltage converter circuit 3200 converts a portion of the outputs from the replica DAC_A 3120 and the replica DAC_B 3140. In particular, the current to voltage converter circuit 3200 converts the $\alpha I_i$, $\alpha Ib_i$, $\alpha Q_i$, and $\alpha Qb_i$ into the voltage domain as $I_v$, $Ib_v$, $Q_v$, and $Qb_v$. The outputs of the current to voltage converter circuit 3200 drive the XOR circuit 3300.

The XOR circuit 3300 may include a XOR stage 1 circuit 3400 connected to a XOR stage 2 circuit 3500. The XOR stage 1 circuit 3400 may be connected to the current to voltage converter circuit 3200. The XOR stage 1 circuit 3400 mixes the converted replica DAC_A 3120 output with that of the converted DAC_B 3140 output. In particular, the $Q_v$ and $Qb_v$ are mixed with the $I_v$ and $Ib_v$. The output of the XOR stage 1 circuit 3400 are FS/2 signals (denoted as $FS_2\_xor$ and $FS_2b\_xor$) in the current domain having delays proportional to the FS/4 clocks. The outputs of the XOR stage 1 circuit 3400 drive the XOR stage 2 circuit 3500.

Figure 6:
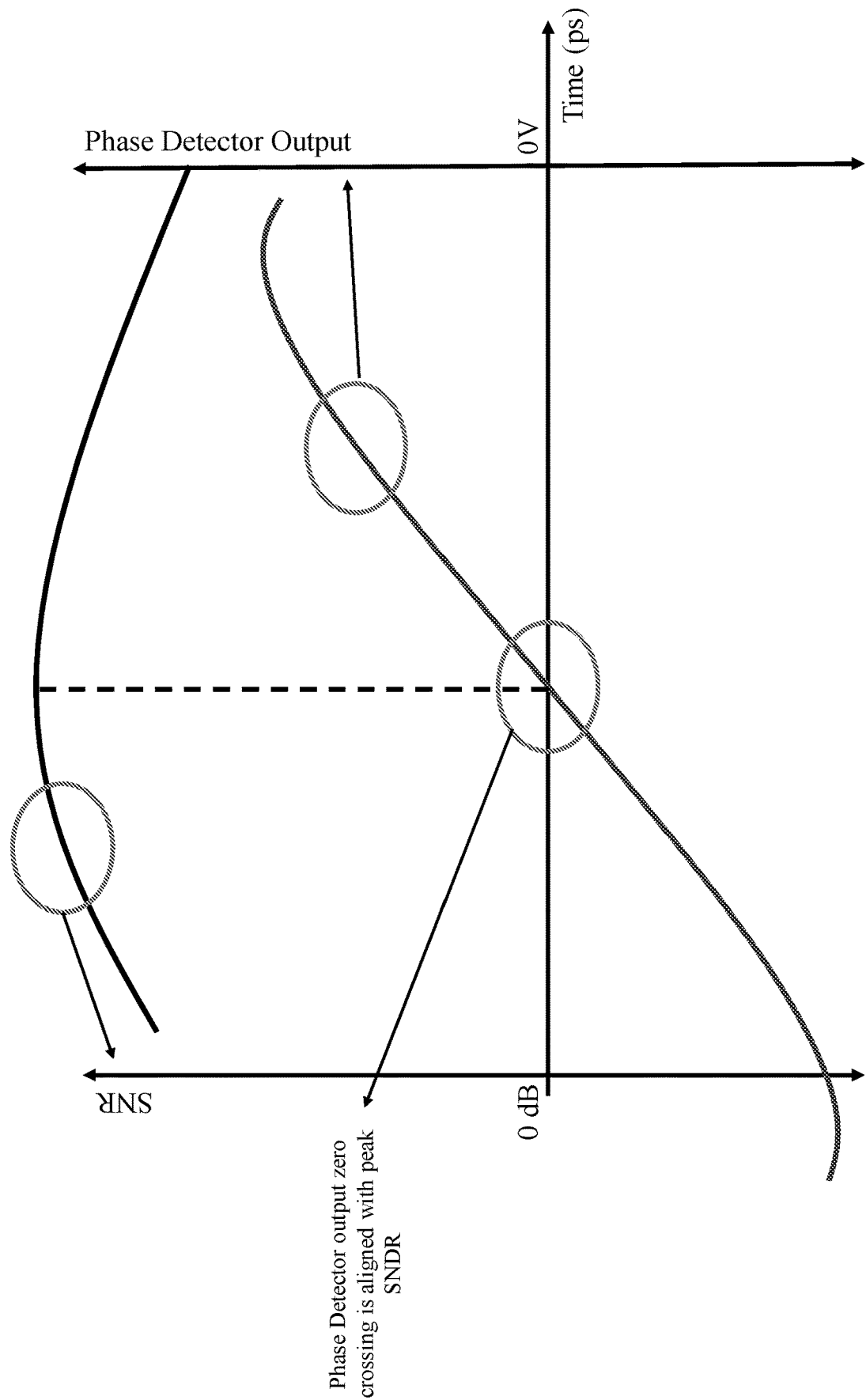
FIG. 6 is a graph of zero crossing at maximum signal-to-noise and distortion ratio in accordance with embodiments of this disclosure.
Figure 7:
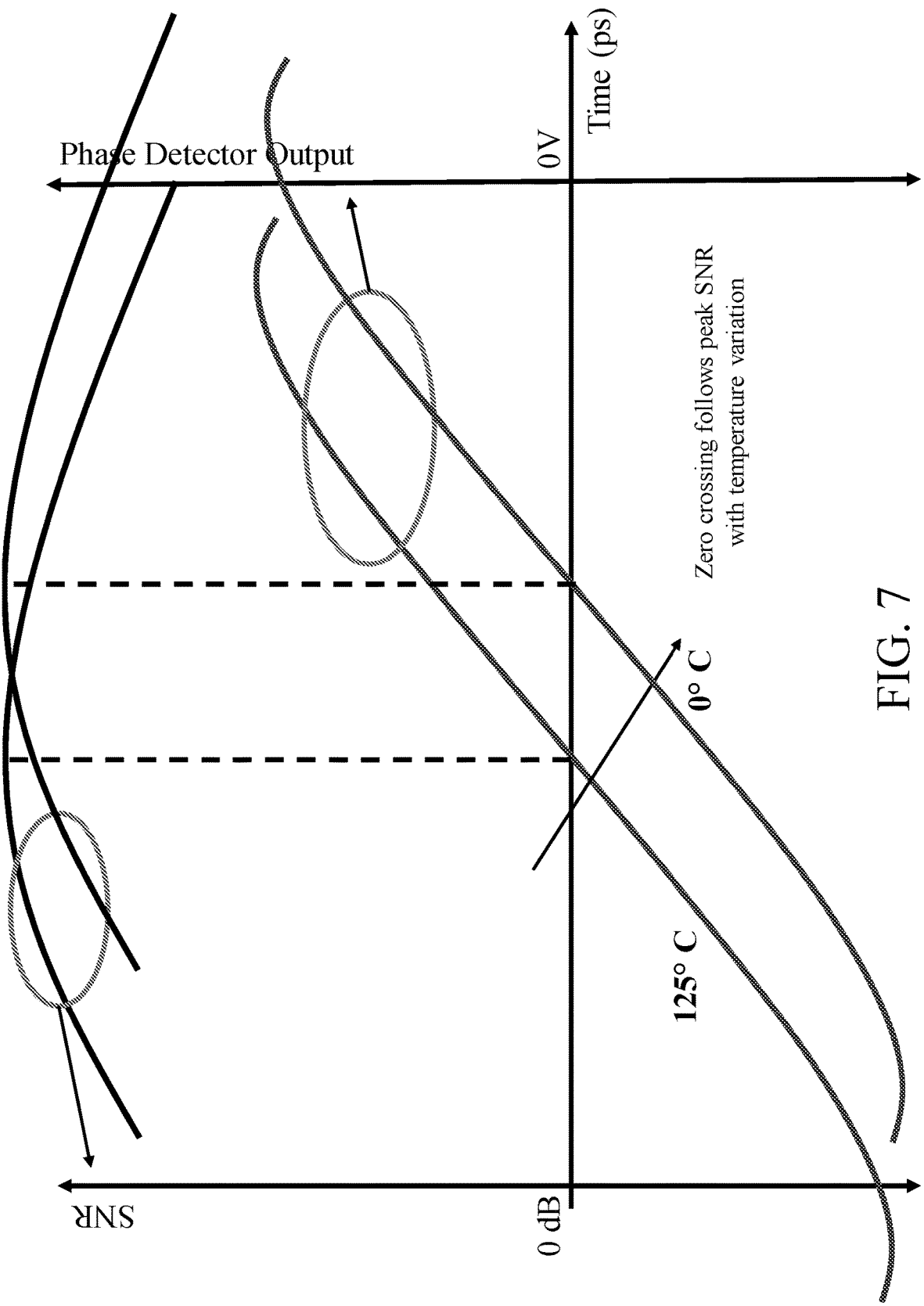
FIG. 7 is a graph of zero crossing at maximum signal-to-noise and distortion ratio over different temperatures in accordance with embodiments of this disclosure.

The XOR stage 2 circuit 3500 may be connected to the XOR stage 1 circuit 3400. The XOR stage 2 circuit 3500 mixes the $FS_2\_xor$ and $FS_2b\_xor$ current signals with the FS/2 clocks (denoted as $FS_2$ and $FS_2b$) from the MUX (i.e., the MUX 1300 of FIG. 1B or the MUX 2175 of FIG. 2). The XOR stage 2 circuit 3500 outputs PD_OUT and PD_OUT_B. The zero crossings of the outputs PD_OUT and PD_OUT_B are aligned with perfect timing or alignment between the FS/2 and FS/4 clocks. Moreover, the zero crossings of the outputs PD_OUT and PD_OUT_B are aligned with a high or maximum signal-to-noise plus distortion region. This is shown for example in FIG. 6, which is a graph of a phase detector output having a zero crossing at a maximum signal-to-noise and distortion ratio in accordance implementations of the disclosure. In addition, FIG. 7 shows a graph of zero crossings at maximum signal-to-noise and distortion ratios over different temperatures in accordance with embodiments of this disclosure. As shown, the zero crossings follow the peak SNR at both 0° C. and 125° C. The output of the phase detector is low pass filtered and sent to variable delays as shown in FIG. 2.

Figure 4:
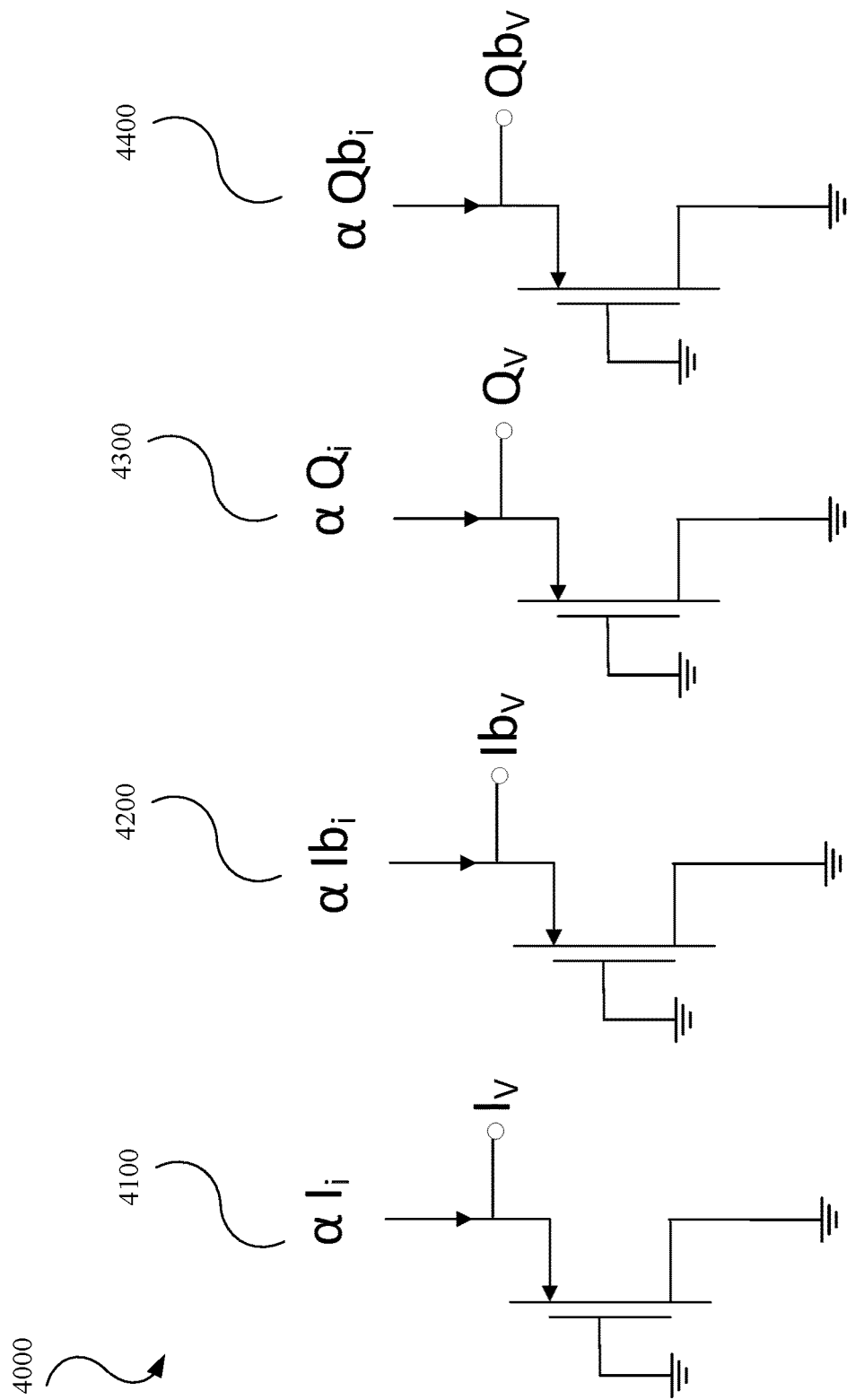
FIG. 4 is a block diagram of an example of a voltage to current converter for a phase detector in accordance with embodiments of this disclosure.

FIG. 4 is a block diagram of an example of a voltage to current converter 4000 for a phase detector in accordance with embodiments of this disclosure. As described herein, the output of the replica DACs are in the current domain. A current to voltage converter 4000 converts a portion of the outputs from the replica DACs into the voltage domain. In an implementation, the current to voltage converter 4000 may include current to voltage converters 4100, 4200, 4300, and 4400. Each of the current to voltage converters 4100, 4200, 4300, and 4400 may be implemented with MOSFETs having the drain and gate tied to ground and having a source tied to one of $\alpha I_i$, $\alpha Ib_i$, $\alpha Q_i$, and $\alpha Qb_i$ respectively, as described in FIG. 3, and outputting one of $I_v$, $Ib_v$, $Q_v$, and $Qb_v$ respectively. Although the four current to voltage converters 4100, 4200, 4300, and 4400 are shown using MOSFETs, other components and devices may be used without departing from the scope of the specification and claims described herein.

Figure 5:
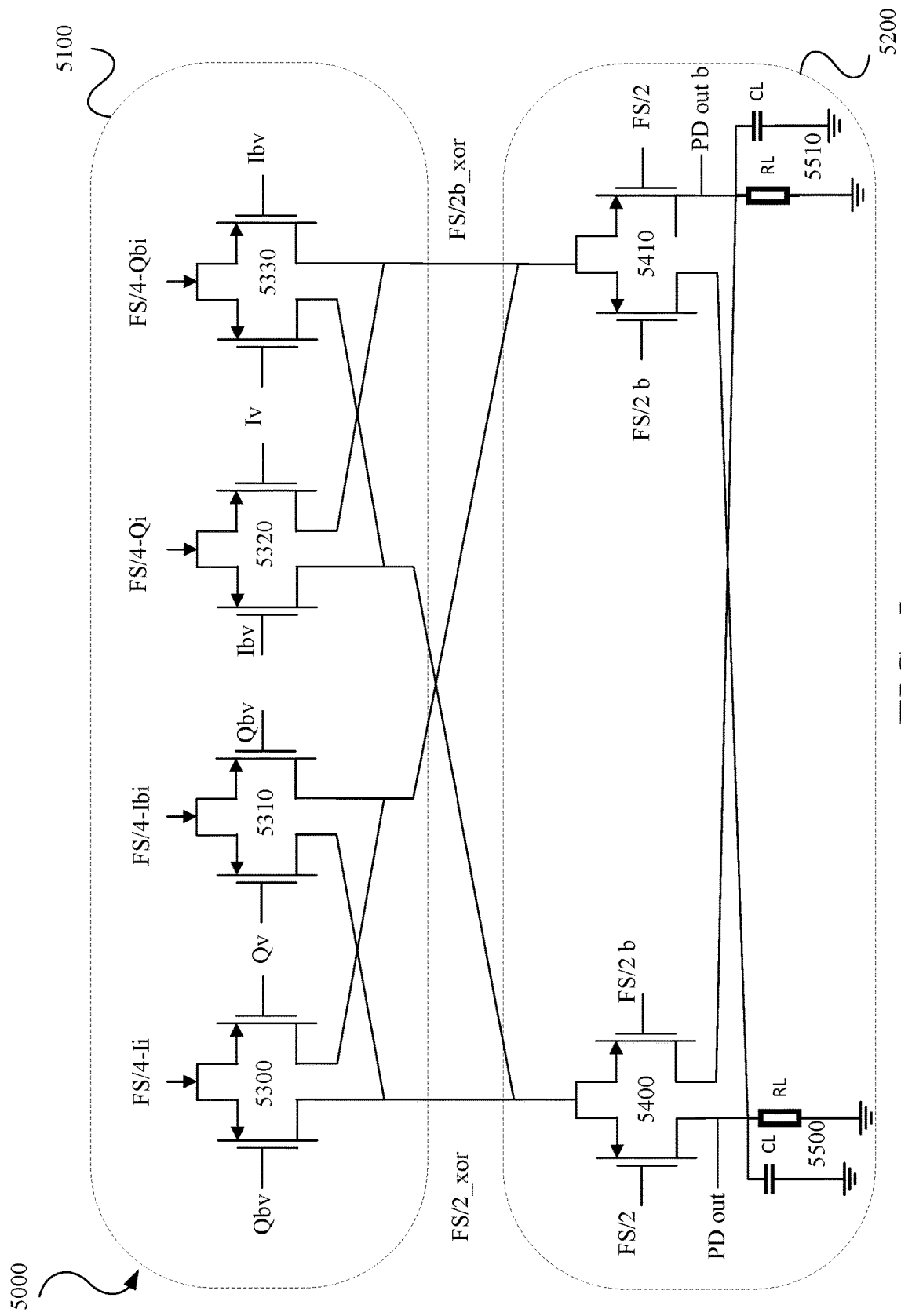
FIG. 5 is a block diagram of an example of an exclusive OR (XOR) circuit for a phase detector in accordance with embodiments of this disclosure.

FIG. 5 is a block diagram of an example of an exclusive OR (XOR) circuit 5000 for a phase detector in accordance with embodiments of this disclosure. The XOR circuit 5000 may include a XOR stage #1 circuit 5100 connected to a XOR stage #2 circuit 5200. Although the XOR circuit 5000 is shown using MOSFETs, other components and devices may be used without departing from the scope of the specification and claims described herein.

The XOR stage #1 circuit 5100 may include multiple pairs of MOSFETs 5300, 5310, 5320, and 5330, where each MOSFET in the pair has the sources tied together and the tied sources are further tied to one of $I_i$, $Ib_i$, $Q_i$, and $Qb_i$, respectively, as described in FIG. 3 (shown as $FS_4$-$I_i$, $FS_4$-$Ib_i$, $FS_4$-$Q_i$, and $FS_4$-$Qb_i$ in FIG. 5). The gates of each pair of MOSFETs 5300, 5310, 5320, and 5330 are tied to one of $Q_v$, $Qb_v$, $I_v$, and $Ib_v$, respectively, where in-phase and quadrature phase elements are mixed as described herein above. The outputs of the XOR stage #1 circuit 5100, denoted Fs2_xor and Fs2b_xor, are tied to the XOR stage #2 circuit 5200.

The XOR stage #2 circuit 5200 may include multiple pairs of MOSFETs 5400 and 5410, where each MOSFET in the pair has the sources tied together and the tied sources are further connected to one drain of each pair of MOSFETs 5300, 5310, 5320, and 5330, respectively. In particular, the Fs2_xor output is tied to MOSFET pair 5400 and the Fs2b_xor output is tied to MOSFET pair 5410. The gates of each pair of MOSFETs 5400 and 5410 are tied to FS2 and FS2b clock signals. The drains of the MOSFET pairs 5400 and 5410 which have the gate tied to the FS$_2$ signal are connected to a low pass filter implemented by a resistor ($R_L$)-capacitor ($C_L$) circuit 5500 and 5510, respectively. The drains of the MOSFET pairs 5400 and 5410 which have the gate tied to the FS2b signal are cross-connected to the low pass filter implemented by the $R_L$-$C_L$ circuit 5510 and 5500, respectively. The filtered outputs (PD out and PD out b) of the XOR stage #2 circuit 5200 (which are the outputs of the phase detector such as phase detector 3000) may be tapped from the connection between the drains of the MOSFET pairs 5400 and 5410 which have the gate tied to the FS2 signal and the $R_L$-$C_L$ circuit 5500 and 5510, respectively.

Figure 8:
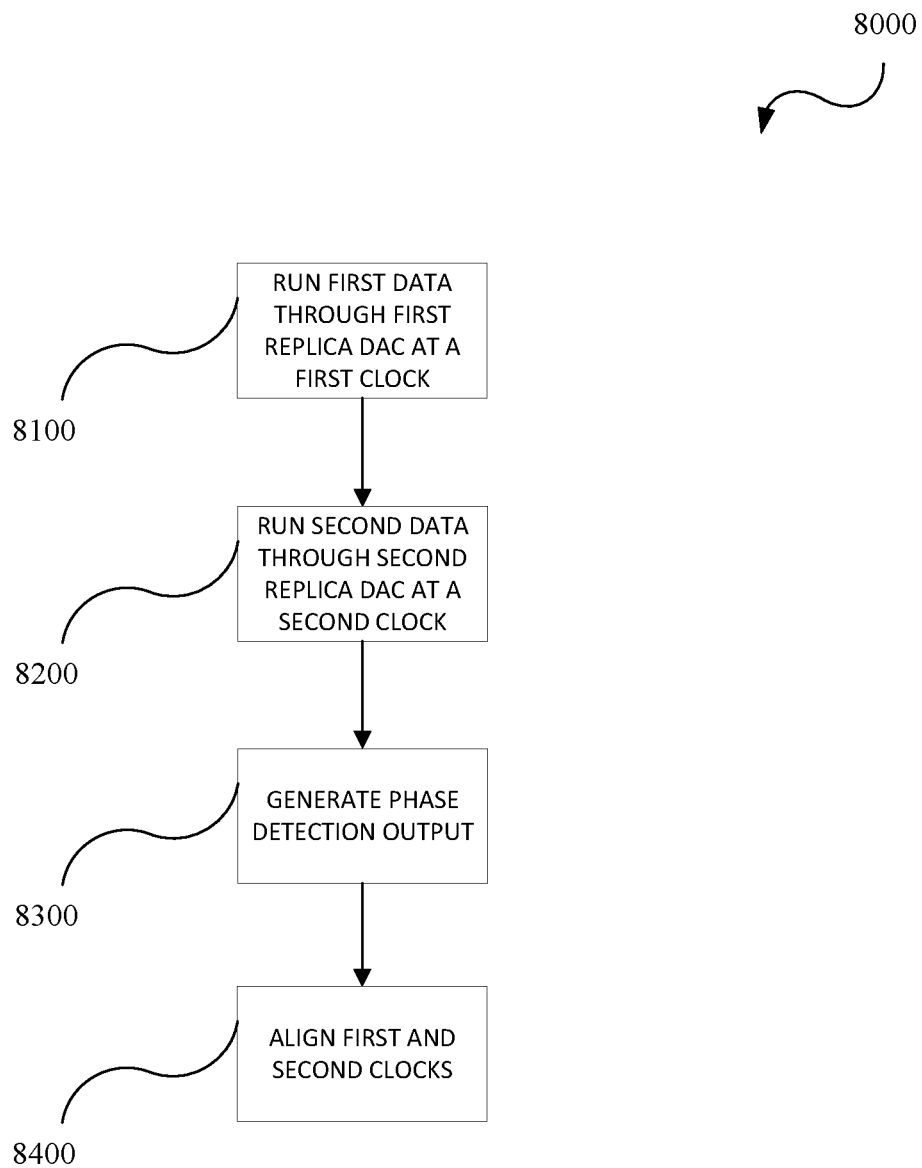
FIG. 8 is a flowchart of an example technique for realization of a time interleaved DAC device in accordance with embodiments of this disclosure.

FIG. 8 is a flowchart of an example method 8000 for realization of a N-time interleaved DAC device in accordance with embodiments of this disclosure. The method 8000 includes: running 8100 a first data through a first replica DAC associated with a first DAC; running 8200 a second data through a second replica DAC associated with a second DAC; generating 8300 a phase detection output by comparing a first replica DAC clock output and a second replica DAC clock output with a multiplexor (MUX) clock; and aligning 8400 a first clock of the first DAC and a second clock of the second DAC with the MUX clock signal by advancing phases of the first clock and the second DAC clock until the phase detection output achieves a zero crossing.

The method 8000 includes running 8100 a first data through a first replica DAC associated with a first DAC and running 8200 a second data through a second replica DAC associated with a second DAC. The first replica DAC and the first DAC operate at a first clock and the second replica DAC and the second DAC operate at a second clock. The running 8100 and running 8200 include providing a replica DAC for each DAC in a two-time interleaved DAC to mimic data paths for the respective DACs.

The method 8000 includes generating 8300 a phase detection output by comparing a first replica DAC output and a second replica DAC output with the MUX clock signal. In an implementation, a frequency or rate of the MUX clock signal is a multiple of the first clock and/or the second clock. The generating 8300 includes converting the first replica DAC output and the second replica DAC output from a current domain to a voltage domain. The generating 8300 further includes mixing the converted first replica DAC output and the converted second replica DAC output to generate a mixed replica output at the frequency of the MUX clock. In an implementation, an XOR circuit is used for mixing the converted first replica DAC output and the converted second replica DAC output. The generating 8300 further includes mixing the mixed replica output with the MUX clock to generate the phase detection output. In an implementation, an XOR circuit is used for mixing the mixed replica output with the MUX clock. The generating 8300 further includes identifying zero crossings of the phase detection output which indicate alignment between the first clock and the second clock with the MUX clock signal.

The method 8000 includes aligning 8400 the first clock and the second clock with the MUX clock by advancing phases of the first clock and the second clock until the phase detection output achieves a zero crossing. In an implementation, the phase rotation is done using variable delays, phase rotators, or the like.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A two-time interleaved digital-to-analog converter (DAC) comprising:
    a first replica DAC associated with a first DAC, the first replica DAC operating at a clock A;
    a second replica DAC associated with a second DAC, the second replica DAC operating at a clock B; and
    a phase detector connected to the first replica DAC and the second replica DAC, the phase detector configured to generate a phase detection output by comparing a first replica DAC output and a second replica DAC output with a multiplexor (MUX) clock, wherein the MUX clock is a multiple of a frequency of the clock A or the clock B,
    wherein the clock A and the clock B being aligned with the MUX clock by advancing phases of the clock A and the clock B until the phase detection output achieves a zero crossing.

2. The two-time interleaved DAC of claim 1, further comprising:
    a first variable delay connected to a filtered output of the phase detector and the first DAC; and
    a second variable delay connected to the filtered output of the phase detector and the second DAC,
    wherein the first variable delay configured to advance the phase of clock A and the second variable delay configured to advance the phase of clock B until the phase detection output achieves the zero crossing.

3. The two-time interleaved DAC of claim 1, wherein one of the first replica DAC output and the second replica DAC output is an in-phase output and another one of the first replica DAC output and the second replica DAC output is a quadrature phase output.

4. The two-time interleaved DAC of claim 3, wherein the phase detector further comprising:
    a current to voltage circuit connected to the first replica DAC and the second replica DAC, the current to voltage circuit configured to convert the in-phase output and the quadrature phase output from a current domain to a voltage domain.

5. The two-time interleaved DAC of claim 4, wherein the phase detector further comprising:
    a first mixer connected to the current to voltage circuit, the first mixer configured to generate a mixed output from the converted in-phase output and the converted quadrature phase output, the mixed output being at a frequency of the MUX clock.

6. The two-time interleaved DAC of claim 5, wherein the first mixer is an exclusive OR (XOR) circuit.

7. The two-time interleaved DAC of claim 5, wherein the phase detector further comprising:
    a second mixer connected to the first mixer, the second mixer configured to generate the phase detection output from the mixed output and the MUX clock.

8. The two-time interleaved DAC of claim 7, wherein the second mixer is an exclusive OR (XOR) circuit.

9. The two-time interleaved DAC of claim 4, wherein the phase detector further comprising:
    an exclusive OR (XOR) circuit connected to the current to voltage circuit, the XOR circuit including:
    a first set of connected transistors tied to the in-phase outputs from the current to voltage circuit;
    a second set of connected transistors tied to the quadrature phase outputs from the current to voltage circuit, wherein the first set of connected transistors and the second set of connected transistors are configured to mix the in-phase outputs and the quadrature phase outputs to generate a mixed output at a frequency of the MUX clock;
    a third set of connected transistors tied to one output of the first set of connected transistors and one output of the second set of connected transistors; and
    a fourth set of connected transistors tied to a remaining output of the first set of connected transistors and a remaining output of the second set of connected transistors, wherein the third set of connected transistors and the fourth set of connected transistors are configured to mix the mixed replica output with the MUX clock,
    wherein the phase detection output is tapped from an output of one of the third set of connected transistors and the fourth set of connected transistors.

10. A N-time time interleaved digital-to-analog converter (DAC) comprising:

a first set of N/2 replica DACs configured to operate at a clock A, each of the first set of N/2 replica DACs associated with a first DAC;

a second set of N/2 replica DACs configured to operate at a clock B, each of the second set of N/2 replica DACs associated with a second DAC; and a phase detector connected to the first set of N/2 replica DACs and the second set of N/2 replica DACs, the phase detector configured to generate a phase detection output by comparing first outputs of the first set of N/2 replica DACs and second outputs of the second set of N/2 replica DACs with a multiplexer (MUX) frequency, wherein the MUX frequency is a multiple of the clock A or the clock B, wherein phases of the clock A and the clock B are advanced until the phase detection output toggles indicating alignment.

11. The N-time interleaved DAC of claim 10, further comprising:

a variable delay circuit connected to a filtered output of the phase detector, the first DAC, and the second DAC, the variable delay circuit configured to align the clock A and the clock B with the MUX clock by advancing phases of the clock A and the clock B until the phase detection output toggles.

12. The N-time time interleaved DAC of claim 10, wherein one of the first outputs and the second outputs are in-phase outputs and another one of the first outputs and the second outputs are quadrature phase outputs.

13. The N-time time interleaved DAC of claim 12, wherein the phase detector further comprising:

a converter circuit connected to the first set of replica DACs and the second set of replica DACs, the converter circuit configured to convert the in-phase outputs and the quadrature phase outputs from a current domain to a voltage domain.

14. The N-time time interleaved DAC of claim 13, wherein the phase detector further comprising:

a mixer connected to the converter circuit, the mixer configured to:

generate a mixed output from the converted in-phase outputs and the converted quadrature phase outputs, a frequency of the mixed output matching the MUX clock; and generate the phase detection output from the matching clock frequency output and the multiplexer clock frequency.

15. The N-time time interleaved DAC of claim 14, wherein the mixer is an exclusive OR (XOR) circuit.

16. The N-time time interleaved DAC of claim 15, wherein the XOR circuit further comprising:

a first set of switches tied to the in-phase outputs;

a second set of switches tied to the quadrature phase outputs, wherein the first set of switches and the second set of switches are configured to mix the in-phase outputs and the quadrature phase outputs to generate the mixed output;

a third set of switches tied to a first output of the first set of switches and a first output of the second set of switches; and a fourth set of switches tied to a second output of the first set of switches and a second output of the second set of switches, wherein the third set of switches and the fourth set of switches are configured to mix the mixed output with the MUX clock, wherein the phase detection output is tapped from an output of one of the third set of switches and the fourth set of switches.

17. A method for realizing a two-time interleaved digital-to-analog converter (DAC), the method comprising:

running first data through a first replica DAC associated with a first DAC, the first replica DAC operating at a clock A;

running second data through a second replica DAC associated with a second DAC, the second replica DAC operating at a clock B;

generating a phase detection output by comparing a first replica DAC output and a second replica DAC output with a multiplexor (MUX) clock, wherein the MUX clock is a multiple of the clock A or the clock B; and aligning the clock A and the clock B with the MUX clock by advancing a phase of the clock A and a phase of the clock B until the phase detection output achieves a zero crossing.

18. The method of claim 17, wherein one of the first replica DAC output and the second replica DAC output is an in-phase output and another one of the first replica DAC output and the second replica DAC output is a quadrature phase output.

19. The method of claim 18, further comprising:

converting the in-phase output and the quadrature phase output from a current domain to a voltage domain;

mixing the converted in-phase output and the converted quadrature phase output to generate a mixed output at a frequency of the MUX clock; and mixing the mixed output with the MUX clock to generate the phase detection output.

20. The method of claim 19, further comprising:

identifying the zero crossings of the phase detection output which indicate alignment between the clock A and the clock B with the MUX clock.

\* \* \* \* \*